United States Patent [19]

Cowley

[11] Patent Number: 4,862,109
[45] Date of Patent: Aug. 29, 1989

[54] PROCESSOR CONTROLLED PHASE LOCKED LOOP MULTI-BAND FREQUENCY SYNTHESIZER

[75] Inventor: Nicholas P. Cowley, Wiltshire, Great Britain

[73] Assignee: Plessey Overseas Limited, Ilford, England

[21] Appl. No.: 130,389

[22] PCT Filed: Apr. 2, 1987

[86] PCT No.: PCT/GB87/00228
§ 371 Date: Feb. 4, 1988
§ 102(e) Date: Feb. 4, 1988

[87] PCT Pub. No.: WO87/06076
PCT Pub. Date: Oct. 8, 1987

[30] Foreign Application Priority Data

Apr. 4, 1986 [GB] United Kingdom ............... 8608303
Jun. 11, 1986 [GB] United Kingdom ............... 8614194

[51] Int. Cl.$^4$ .............................................. H03L 7/18
[52] U.S. Cl. ........................................ 331/16; 331/25
[58] Field of Search ....................... 331/1 A, 18, 25, 16

[56] References Cited

U.S. PATENT DOCUMENTS 4,584,539 4/1986 Stankey .................................. 331/16

FOREIGN PATENT DOCUMENTS 3247082 7/1983 Fed. Rep. of Germany .
1528814 10/1978 United Kingdom .

OTHER PUBLICATIONS

"AM-FM Digital Tuning System", By T. B. Mills, Nov. 1978, IEEE Trans. Consumer Electronics, vol. CE-24, No. 4, pp. 507-513.

Primary Examiner—Siegfried H. Grimm
Attorney, Agent, or Firm—Fleit, Jacobson, Cohn, Price, Holman & Stern

[57] ABSTRACT

The frequency synthesizer has a store which temporarily stores a data word for controlling a processor. A local oscillator provides a signal for the processor which drives an output interface to produce the required frequency. The output interface and processor are controlled by a control and decode circuit which also controls a reference divider. The output of the reference divider is compared with an output from the processor by a phase comparator and the signal generated is used to control the local oscillator. The reference divider is driven by a single reference oscillator.

8 Claims, 3 Drawing Sheets

PROCESSOR CONTROLLED PHASE LOCKED LOOP MULTI-BAND FREQUENCY SYNTHESIZER

The present invention relates to a processor controlled phase locked loop multi-band frequency synthesizer.

Known frequency synthesizers follow the basic architecture as shown in FIG. 1. In FIG. 1 a simple circuit concept is greatly complicated by the need for a switchable oscillator SWO which would be required for all frequency bands the oscillator must cover. The switchable local oscillator has to be controlled by an n-wire highway N which can be obtained by inputting control information to the circuit BD decoding this and outputting to the highway. The system may be further complicated by the requirement for more than one reference crystal oscillator.

In FIG. 1, the switchable oscillator SWO generates an output signal for controlling the divider chain D1, D2. The divider D2 provides an input for the signal processor PROC, which also receives programming information from the shift register SR. The programming information is generated from the input data ID. The shift register SR also generates a control signal for the band decode circuit BD which, as discussed above, controls the switchable oscillator SWO.

A reference oscillator RO is controlled by a reference crystal RX. The reference oscillator RO drives a reference divider RD, the output from which is compared with a signal from the signal processor PROC, by a comparator circuit PC. The comparator circuit PC generates an output signal which drives a loop amplifier LA. The output from the loop amplifier LA is fed back to the switchable oscillator SWO and provides a phase-locked loop. The switchable oscillator SWO generates a signal which is presented to a mixer circuit MIX, which is combined with an RF signal, to generate the output signal IF. In FIG. 1, circuits which function in a similar manner to the circuits shown in FIG. 2, described later, have been given the same identity.

If the overall system is required to cover a frequency band which has a totally different requirement for step size, comparison frequency input, frequency range etc., then the system is greatly complicated by the need for a second frequency synthesis loop, or any other method for obtaining the local oscillator.

The frequency synthesizer according to the present invention provides the advantages of a simplified design, a reduction in external components, the need for only one reference crystal, the replacement of the switchable multi-band oscillator by a single band local oscillator, and the removal of the n-wire highway.

Accordingly an aim of the present invention is to provide a frequency synthesizer of a more simple design than hitherto known frequency synthesizers.

According to the present invention there is provided a frequency synthesizer including a store for receiving and temporarily storing a data word received on a data highway, a processor circuit controllable by output signals generated by the store, a prescale divider circuit driven by a local oscillator and arranged to provide a signal for presentation to the processor circuit, a reference divider chain providing a reference signal presented to a phase comparator which also receives a signal from the processor circuit and arranged to provide an output signal for presentation to a loop amplifier which controls the local oscillator, and a control and decode circuit arranged to receive a signal from the store, characterized in that the reference divider chain is driven by a single reference oscillator, and the prescale divider circuit and processor circuit generate output signals for presentation to an output interface under the control of the control and decode circuit which generates control signals for controlling the processor circuit and the output interface, said control and decode circuit also generates a control signal which is fed-back to the reference divider chain whereby the reference signal applied to the phase comparator is altered in a manner which requires the reference divider chain to be driven by the single reference oscillator only.

An embodiment of the present invention will now be described with reference to the accompanying drawings wherein:

FIG. 2a is placed to the right of FIG. 2.

Figure 1:
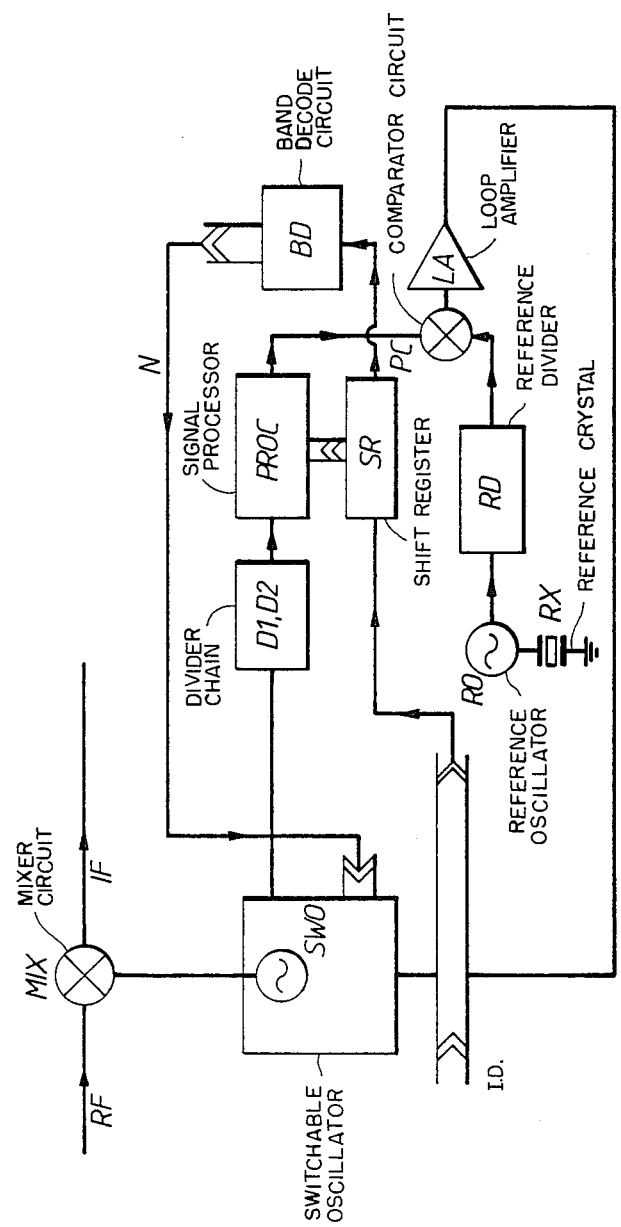
FIG. 1 shows a prior art frequency synthesizer.
Figure 2:
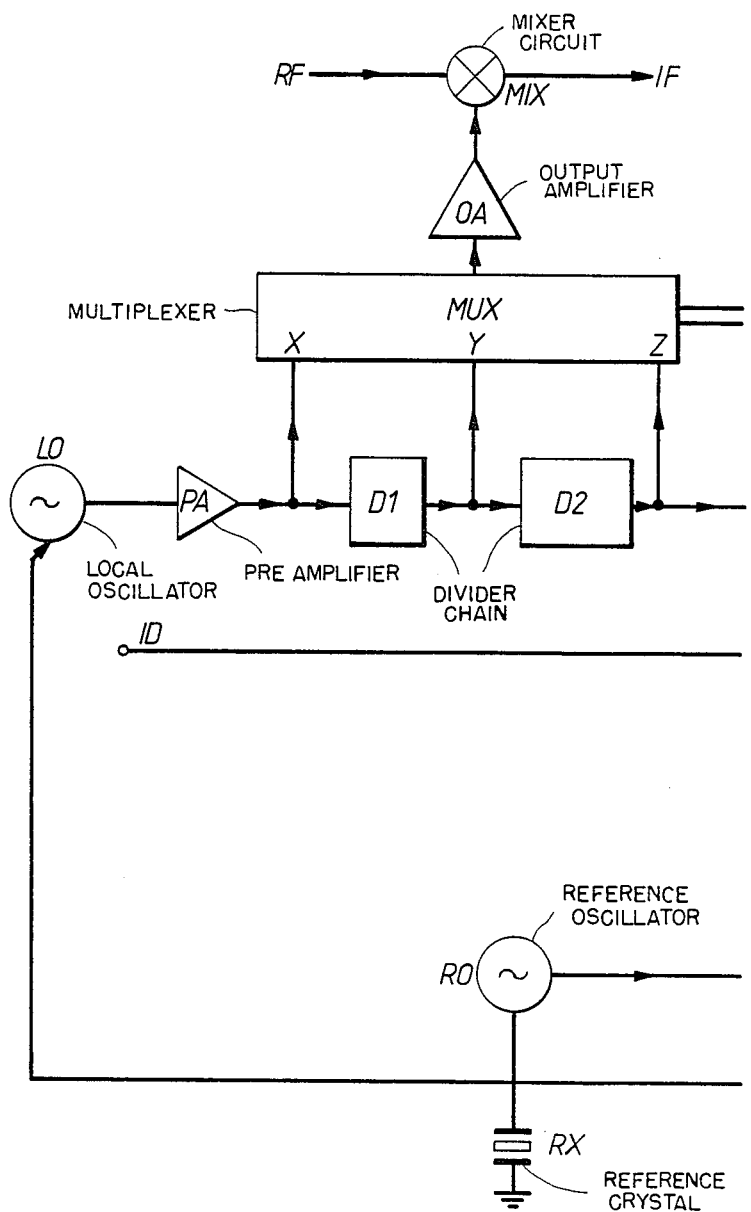
FIG. 2 and FIG. 2a show a frequency synthesizer according to the present invention, when
Figure 2A:
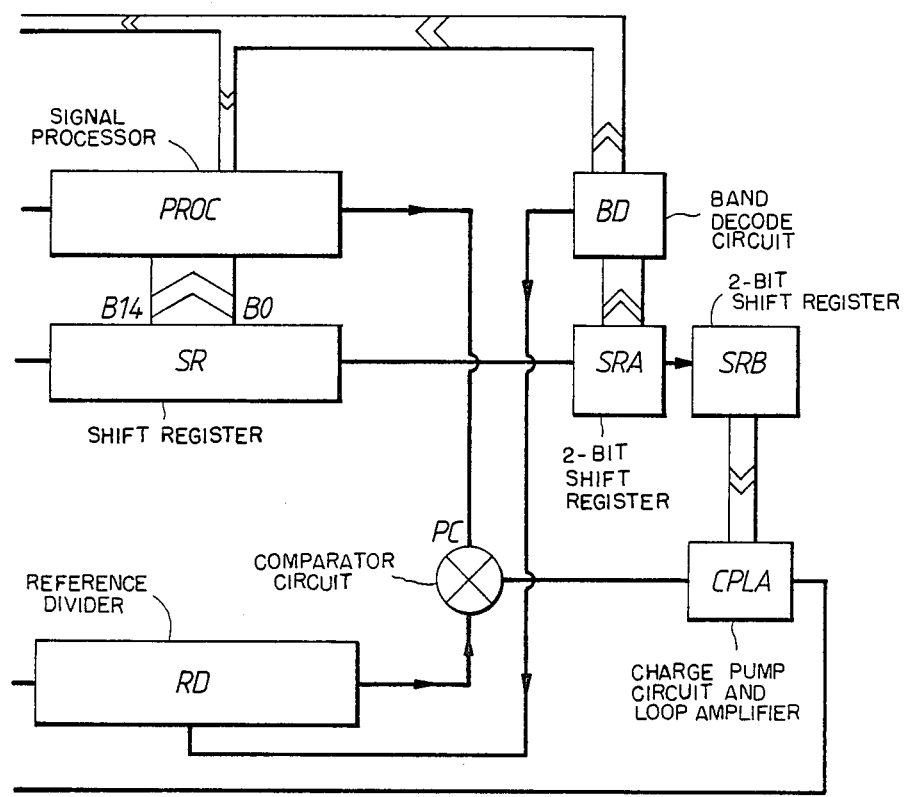

Referring to FIG. 2, a phase-locked loop integrated circuit is shown intended for a tuner required to tune to the following bands:

(a) UHF band 450–900 MHz
(b) VHF band 3 170–230 MHz
(c) VHF band 1 045–090 MHz
(d) FM radio 060–120 MHz Assuming high side mixing, these bands correspond to a required local oscillator output frequency of:

(a) 490–940 MHz
(b) 210–270 MHz
(c) 85–130 MHz
(d) 70–130 MHz

These frequency ranges require a local oscillator input LO in the range of 420–1040 MHz.

In all TV bands, the fine step size in the local oscillator output is 62.5 KHz, with a comparison frequency of 7.8125 KHz. In the FM band, the step size is 25 KHz with a comparison frequency 12.5 KHz.

The local oscillator LO, is buffered by a pre-amplifier PA, the output from which provides an input signal X for a multiplexer MUX, which forms part of the output interface, and an input signal for the divider chain D1, D2. Divider D1 is a divide by two circuit, the output of which provides an input signal Y for the multiplexer MUX, and an input signal to the divider circuit D2. Divide D2 is a divide by four circuit, the output of which provides an input signal Z for the multiplexer MUX, and an input to the 15-bit signal processor PROC.

A 15-bit shift register SR receives input data ID, and provides output signals b0–b14 to provide the programming for the signal processor PROC.

A reference oscillator RO is controlled by a reference crystal RX. The reference oscillator RO drives a reference divider RD, the output from which is compared with an output from the signal processor PROC by a phase comparator circuit PC. The comparator circuit PC generates an output signal which drives a charge pump circuit and loop amplifier CPLA. The output from this circuit CPLA is fed back to control the local oscillator and provides the phase-locked loop.

Control for the frequency synthesizer is provided by the shift register SR, a 2-bit shift register SRA, a 2-bit shift register SRB and a band decode circuit BD. An output of the shift register SR is carried to shift register SRA which is serially connected to the shift register SRB. The shift register SRA controls the multiplexer MUX, the signal processor PROC and the reference divider RD. The shift register SRB controls the magnitude of the charge pump current for the charge pump and loop amplifier circuit CPLA.

The output of the multiplexer MUX is passed through an output amplifier, forming part of the output interface, to a mixer circuit MIX and combined with the signal RF, to generate the output signal IF.

In operation the required band is set up by way of the shift register SRA, the output of which is decoded by the band decode circuit BD. The band decode circuit BD sends out control information to the multiplexer MUX, the signal processor PROC and the reference divider RD, which cause correct operation of the frequency synthesizer in the required band as follows:

For band (a), the input X is selected for the multiplexer MUX. The signal processor PROC is switched as a 15-bit programmable divider, the division ratio of which is set up by way of the 15-bit shift register SR. The reference divider RD is set to divide by 512.

For band (b), the input Y of the multiplexer MUX is selected. The signal processor PROC is switched as a divide by two and 14-bit programmable divider, the programmable division ratio of which is set up by way of bits b13–b0 of the 15-bit shift register SR. The reference divider RD is set to divide by 512

For band (c), the input Z is selected for the multiplexer MUX. The 15-bit signal processor PROC is switched as a divide by eight and a 12-bit programmable divider, the programmable division ratio of which is set up by way of bits b11–b0 of the 15-bit shift register SR. The reference divider RD is set to divide by 512.

For band (d), the input Z is selected for the multiplexer MUX. The 15-bit signal processor is switched as a divide by two and a 13-bit programmable divider, the programmable division ratio of which is set up by way of bits b12–b0 of the 15-bit shift register SR. The reference divider RD, is set to divide by 320.

The invention can be extended to cover systems containing more than one switchable local oscillator such as a TV/RADIO synthesis system. This is achieved by having an input interface in parallel with the output interface enabling signals to be buffered into the divide by N chain at a suitable point. The circuit may be also extended to have switchable charging currents within the loop amplifier.

The local oscillator may also be incorporated in the circuit so simplifying design by removal of the external local oscillator. This local oscillator may be a fundamental or frequency doubling type, and if of the doubling type, may offer signals at a sub-harmonic L.O. frequency to the divide by N chain so eliminating part of the prescale stage. The local oscillator may also be used as a local oscillator combined mixer, so eliminating the external mixer. This may be fundamental or sub-harmonic mixer and may afford R.F. amplification on its RF input.

I claim:

1. A frequency synthesizer including a store for receiving and temporarily storing a data word received on a data highway, a processor circuit controllable by output signals generated by the store, a prescale divider circuit driven by a local oscillator and arranged to provide a signal for presentation to the processor circuit, a reference divider chain providing a reference signal presented to a phase comparator which also receives a signal from the processor circuit and arranged to provide an output signal for presentation to a loop amplifier which controls the local oscillator, and a control and decode circuit arranged to receive a signal from the store, characterized in that the reference divider chain is driven by a single reference oscillator, and the prescale divider circuit and processor circuit generate output signals for presentation to an output interface under the control of the control and decode circuit which generates control signals for controlling the processor circuit and the output interface, said control and decode circuit also generates a control signal which is fed-back to the reference divider chain whereby the reference signal applied to the phase comparator is altered in a manner which requires the reference divider chain to be driven by the single reference oscillator only.

2. A frequency synthesizer as claimed in claim 1, wherein the control and decode circuit comprises a first shift register arranged to control a band decode circuit, and a second shift-register arranged to control the loop amplifier.

3. A frequency synthesizer as claimed in claim 2, wherein the second shift register controls the loop amplifier by way of a charge pump circuit.

4. A frequency synthesizer as claimed in claim 2 or 3 wherein the band decode circuit generates control signals for controlling a multiplexer forming part of the output interface, for controlling the processor circuit and for controlling the reference divider.

5. A frequency synthesizer as claimed in claim 4, wherein a first frequency band is synthesized by the band decode circuit selected a first input of the multiplexer; arranging the processor circuit to be operated as a 15-bit programmable divider, and arranging the reference divider to divide by 512.

6. A frequency synthesizer as claimed in claim 4, wherein a second frequency band is synthesized by the band decode circuit selecting a second input of the multiplexer; arranging the processor circuit to be operated as a divide by two and a 14-bit programmable divider, and arranging the reference divider to divide by 512.

7. A frequency synthesizer as claimed in claim 4, wherein a third frequency band is synthesized by the band decode circuit selecting a third input of the multiplexer; arranging the processor circuit to operate as a divide by eight and a 12-bit programmable divider, and arranging the reference divider to divide by 512.

8. A frequency synthesizer as claimed in claim 4, wherein a fourth frequency band is synthesized by the band decode circuit selecting a third input to the multiplexer; arranging the processor circuit to operate as a divide by two and a 13-bit programmable divider, and arranging the reference divider to divide by 320.

* * * * *